United States Patent
Hao

(10) Patent No.: US 9,551,732 B2
(45) Date of Patent: Jan. 24, 2017

(54) APPARATUS AND METHOD FOR ALTERNATING CURRENT PHYSICAL SIGNALS MEASUREMENT AND DATA ACQUISITION

(76) Inventor: Yushan Hao, Baoding (CN)

( * ) Notice: Subject to any disclaimer, the term of this patent is extended or adjusted under 35 U.S.C. 154(b) by 468 days.

(21) Appl. No.: 14/124,879

(22) PCT Filed: Jun. 11, 2012

(86) PCT No.: PCT/CN2012/076692
§ 371 (c)(1),
(2), (4) Date: Dec. 9, 2013

(87) PCT Pub. No.: WO2012/167747
PCT Pub. Date: Dec. 13, 2012

(65) Prior Publication Data
US 2014/0125314 A1    May 8, 2014

(30) Foreign Application Priority Data

Jun. 9, 2011 (CN) .......................... 2011 1 0161132

(51) Int. Cl.
*G01R 19/00* (2006.01)
*G01R 19/06* (2006.01)
(Continued)

(52) U.S. Cl.
CPC ........... *G01R 19/00* (2013.01); *G01R 19/0084* (2013.01); *G01R 19/0092* (2013.01); *G01R 19/06* (2013.01);
(Continued)

(58) Field of Classification Search
CPC ................................ G01R 19/00; G01R 19/06
See application file for complete search history.

(56) References Cited

U.S. PATENT DOCUMENTS 4,366,521 A * 12/1982 Jessee .................... H02H 3/343
324/108
5,249,150 A * 9/1993 Gruber ............... G01R 19/0007
702/195
(Continued)

FOREIGN PATENT DOCUMENTS

| CN | 101762743 A | 6/2010 |
| CN | 102331535 A | 1/2012 |
| JP | 11218551 A | 8/1999 |

OTHER PUBLICATIONS

Machine translation of CN 101762743 Jun. 2010.*
International Searching Authority, "Search Report," issued in connection with International Application No. PCT/CN2012/076692, mailed on Dec. 13, 2012, 5 pages.
International Searching Authority, "Written Opinion," issued in connection with International Application No. PCT/CN2012/076692, mailed on Dec. 9, 2013, 6 pages.
(Continued)

*Primary Examiner* — Christ Mahoney
(74) *Attorney, Agent, or Firm* — Troutman Sanders LLP

(57) ABSTRACT

An apparatus for AC physical signals measurement and data acquisition and the method for the same are provided. The apparatus for AC physical signals measurement and data acquisition comprises an analog sampling channel for inputting an AC signal and outputting an analog sampling value; a sampling switch for performing re-sampling to obtain data frequency as required by the receiving side; a register for storing a re-sampling value from the sampling switch; a bus for outputting the re-sampling value in the register to the receiving side; a timing controller for controlling the analog sampling channel and the re-sampling frequency of the sampling switch; and a digital low-pass filter, which has an input connected with the analog sampling value outputted by the analog sampling channel and an output connected with the sampling switch, filters out high frequency components from the sampling value, and has a cut-off frequency that should be lower than 0.5 times the re-sampling frequency of the sampling switch. The apparatus and method for AC physical signals measurement and data acquisition improve accuracy of remote measurement for electric power physical (Continued)

quantities. Not only waveform values are outputted by re-sampling, effective values, steady state values and their fundamental/harmonic wave effective values and steady state values are also outputted. Thus, various requirements by the receiving side on remote measurement data are satisfied.

17 Claims, 5 Drawing Sheets

(51) Int. Cl.
    *G01R 19/25*     (2006.01)
    *G01R 21/133*     (2006.01)

(52) U.S. Cl.
    CPC ....... *G01R 19/2509* (2013.01); *G01R 19/2513* (2013.01); *G01R 21/1331* (2013.01)

(56) References Cited

U.S. PATENT DOCUMENTS

| | | | |
|---|---|---|---|
| 6,185,508 B1* | 2/2001 | Van Doorn | G01R 21/1331 324/140 R |
| 8,129,980 B2* | 3/2012 | Seki | G01R 19/2513 324/76.39 |
| 9,048,726 B1* | 6/2015 | Tang | H02M 1/12 |
| 2009/0295365 A1 | 12/2009 | Solar et al. | |

OTHER PUBLICATIONS

International Searching Authority, "International Preliminary Report on Patentability," issued in connection with International Application No. PCT/CN2012/076692, mailed on Dec. 10, 2013, 7 pages.

\* cited by examiner

APPARATUS AND METHOD FOR ALTERNATING CURRENT PHYSICAL SIGNALS MEASUREMENT AND DATA ACQUISITION

TECHNICAL FIELD

The invention relates to techniques for power system automation, and particularly, to an apparatus and method for alternating current (AC) physical signals measurement and data acquisition.

BACKGROUND

In power dispatching automation, measurement and data acquisition for electric power physical quantities was performed by a Remote Terminal Unit (RTU) in the early days, and has been performed by substation integrated automation in recent years. It is performed by a measuring unit in a digital substation; by an electric energy meter or a distribution transformer terminal in power utilization automation (such as power utilization information system, intelligent power utilization); by a power distribution switch terminal in power distribution automation; or by a measuring and transducing unit in a generator excitation controller. In all the measuring units or terminals mentioned above, the measurement and data acquisition (simply referred to as "remote measurement" hereinafter) process is such that an AC current i and an AC voltage u are inputted and sampled at a predetermined sampling interval Δ (analog-digital conversion) to obtain a sampling value $i_k$ of the current and a sampling value $u_k$ of the voltage; other physical parameters, such as AC current effective value $I_k$, AC voltage effective value $U_k$, active power $P_k$, reactive power $Q_k$ (k=1, 2, ...) and the like, are then calculated from $i_k$ and $u_k$, and $P_k$ and $Q_k$ are accumulated to derive active electric energy $W_k$ and reactive electric energy $V_k$; then, re-sampling is performed at an interval of M (also known as freezing of data by a timing designated by the receiving side) to output re-sampling values $I_j$, $U_j$, $P_j$ and $Q_j$ of the electric power physical quantities to the receiving side. The receiving side can receive them locally or remotely. Local reception can occur within the same apparatus, or within a different apparatus deployed nearby. Remote reception occurs from a long distance. The received remote measurement data is applied on the receiving side.

In the above remote measurement process, the sampling interval Δ generally can satisfy the Shannon sampling theorem, that is, the sampling frequency $f_A=1/\Delta>2\times f_c$ (where $f_c$ is the cut-off frequency of the sampled signal). Therefore, the calculated effect values of the physical quantities, such as $I_k$, $U_k$, $P_k$ and $Q_k$, do not have the aliasing problem. However, after the re-sampling, since the re-sampling frequency $f_W<f_c$ does not satisfy the Shannon sampling theorem, there will be an aliasing of high frequency components into low frequency components and as a result, an aliasing error will arise.

Currently, new energy power generation, direct-current (DC) transmission and non-linear load have been increasingly prevalent, and harmonic wave content has been greater and greater in power systems. As a result, the aliasing error as mentioned above has become larger and larger. Since calculation of reactive power requires an assumption that the current and voltage are sinusoidal signals, the error of reactive power and reactive electric energy is even bigger, to an extent that cannot be ignored.

For the receiving side, the effect values of the fundamental wave components, i.e., $I_j^1$, $U_j^1$, $P_j^1$ and $Q_j^1$, are more valuable than the effect values $I_j$, $U_j$, $P_j$ and $Q_j$. For three-phase AC, fundamental wave positive sequence components, i.e., $I_{(1)j}^1$, $U_{(1)j}^1$, $P_{(1)j}^1$ and $Q_{(1)j}^1$, are more valuable than three-phase effect values $I_j$, $U_j$, $P_j$ and $Q_j$. However, no measuring units or apparatuses of the prior art have outputted fundamental wave components and positive sequence components. As a result, it is difficult to apply electric power physical quantities at the receiving side.

Re-sampling in power applications is divided into three categories: (1) re-sampling of $i_k$ and $u_k$ to output $i_j$ and $u_j$, which is called waveform re-sampling, with the re-sampling interval denoted by $M_W$, and the output being waveform values; (2) quick re-sampling of $I_k$, $U_k$, $P_k$ and $Q_k$, which is called effective value re-sampling, with the re-sampling interval denoted by $M_T$, and the output being effect values; (3) slow re-sampling of $I_k$, $U_k$, $P_k$ and $Q_k$, which is called steady state re-sampling, with the re-sampling interval denoted by $M_S$, and the output being steady state values. Typically, $M_W<M_T<M_S$.

Chinese Invention Patents ZL200910158375.x and ZL200910158370.7 (to Hao YuShan, entitled "CONTINUOUS PHYSICAL SIGNALS MEASUREMENT DEVICE AND METHOD") provides steady state data remote measurement and full state data remote measurement for general physical data. However, the output frequency does not conform to the above re-sampling frequency. Also, too many contents are outputted. It is thus inconvenient to apply it directly to power automation systems.

SUMMARY

In view of the foregoing, an objective of the present invention is to provide an electric power physical signal remote measurement apparatus and method for inputting an AC current i and/or an AC voltage u (referred to as AC) and outputting AC waveform values, effective values or steady state values and effective values or steady state values of their fundamental wave and sequence components, as required by the receiving side.

An apparatus for AC physical signals remote measurement according to the invention, comprising:

an analog sampling channel for performing analog sampling on an input AC signal to output an analog sampling value;

a sampling switch for performing re-sampling to obtain remote measurement data frequency as required by the receiving side;

a register for storing the re-sampling value from the sampling switch;

a bus for outputting the re-sampling value in the register to the receiving side;

a timing controller for controlling the analog sampling channel and the re-sampling frequency of the sampling switch; and a digital low-pass filter, which has an input connected with the analog sampling value outputted by the analog sampling channel and an output connected with the sampling switch, filters out high frequency components from the sampling value, and has a cut-off frequency that should be lower than 0.5 times the re-sampling frequency of the sampling switch.

If remote measurement of AC effective values is desired, then in addition to the elements of the above solution, an effective value calculation device needs to be further provided between the analog sampling channel and the digital low-pass filter for calculating an effect value for the sampling value from the analog sampling channel and outputting it to the low-pass filter.

If remote measurement of AC harmonic wave effective values is desired, then in addition to the elements of the above solution for effective value remote measurement, a harmonic wave decomposition device needs to be further provided in parallel with the effective value calculation device between the analog sampling channel and the digital low-pass filter. The harmonic wave decomposition device includes a fundamental/harmonic wave decomposition device for performing fundamental/harmonic wave decomposition on the sampling value from the analog sampling channel to obtain a fundamental/harmonic wave vector; and an amplitude calculation device, a real part calculation device and an imaginary part calculation device, which receive the fundamental/harmonic wave vector from the fundamental/harmonic wave decomposition device simultaneously to output a fundamental/harmonic wave amplitude, a fundamental/harmonic wave real part and a fundamental/harmonic wave imaginary part, respectively, to the digital low-pass filter.

Since during the process of harmonic wave decomposition, data amount of remote measurement will increase remarkably, the remote measurement apparatus with harmonic wave decomposition needs to include:

a selection data register for storing selection data set by the receiving side though the bus; and a selection switch provided before the register, wherein for selection bits controlled by the selection data register, when a selection bit is 1, the data is selected and the re-sampling value enters into the register to be stored; otherwise, the re-sampling value is not in the register.

If only the data of the $m^{th}$ harmonic wave is desired, a harmonic wave order register may be provided for storing harmonic wave order data m set by the receiving side to control the fundamental/harmonic wave decomposition device to output an $m^{th}$ harmonic wave vector.

If measurement of three-phrase AC signals is performed, then in addition to the elements of the above apparatus for AC physical signals remote measurement, a sequence decomposition device is further provided, which performs sequence decomposition on the three single-phase fundamental/harmonic wave values outputted by the fundamental/harmonic wave decomposition device to obtain three-phrase AC positive sequence components, negative sequence components and zero sequence components, each of which goes through the amplitude calculation device, the real part calculation device and the imaginary part calculation device simultaneously to output positive sequence, negative sequence, and zero sequence effective values, real parts and imaginary parts, which are filtered by the digital low-pass filter to remove high frequency components.

If remote measurement is performed with respect to the AC steady state, then in the above solution, the digital low-pass filter includes:

an averaging device which is connected with the effective value calculation device for obtaining an average value of the AC effective value outputted by the effective value calculation device, the real part and the imaginary part; and a judging device which is connected with the effective value calculation device, and provides a flag F to the averaging device in accordance with the effective value outputted by the effective value calculation device, wherein when the effective value is in a steady state process, F=0; otherwise, when the effective value is in a transient state process, F=1; and when F changes from 1 to 0, the average value is reset to zero, and when F=1, the average value is a value that cannot be reached, which, upon arrival at the receiving side, is removed as bad data.

The invention also provides an AC remote measurement apparatus suitable for use in metering and measuring devices such as a single-phase electric energy meter or the like, the apparatus comprising:

an analog sampling channel for inputting an AC current i and an AC voltage u and outputting a current sampling value $i_k$ and a voltage sampling value $u_k$;

a multiplication accumulator for inputting the current sampling value $i_k$ and the voltage sampling value $u_k$ and outputting active electric energy $W_k$;

a harmonic wave decomposition device for performing fundamental and harmonic wave decomposition on the current sampling value $i_k$ and the voltage sampling value $u_k$ to obtain fundamental and $m^{th}$ harmonic wave vectors;

an amplitude calculation device for inputting the fundamental and $m^{th}$ harmonic wave vectors from the harmonic wave decomposition device and outputting fundamental and $m^{th}$ harmonic wave amplitudes;

a power calculation device for inputting the voltage and current fundamental and $m^{th}$ harmonic wave vectors from the harmonic wave decomposition device to obtain fundamental and $m^{th}$ harmonic wave active power and reactive power;

an accumulator for inputting and accumulating the fundamental wave reactive power from the power calculation device and outputting reactive electric energy;

an averaging device for inputting the fundamental and $m^{th}$ harmonic wave amplitudes from the amplitude calculation device and the fundamental and $m^{th}$ harmonic wave active power and reactive power from the power calculation device and outputting their average values in a steady state;

a sampling switch for inputting the average values from the averaging device and the active electric energy and the reactive electric energy from the accumulators, performing re-sampling, and outputting their re-sampling values;

a register for storing the re-sampling values from the sampling switch;

a bus for outputting the re-sampling values in the register to the receiving side;

a judging device for sending a flag F to the averaging device in accordance with the fundamental wave voltage amplitude, the fundamental wave current amplitude or the fundamental wave power are in the steady state or transient states, wherein when the flag F changes from 1 to 0, the averaging device is reset to zero, and when F=1, the output of the averaging device is a value that cannot be reached, which is removed as bad data on the receiving side;

a timing control device for performing timing control on the analog sampling channel and the sampling switch;

a selection data register for storing selection data set by the receiving side through the bus; and a harmonic wave order register for storing harmonic wave order data m set by the receiving side to control the fundamental/harmonic wave decomposition device to output fundamental and $m^{th}$ harmonic wave vectors.

As to remote measurement of a three-phrase AC electric energy meter, it is cannot simply repeat the processes of the above AC remote measurement apparatus. A sequence decomposition device needs to be provided for inputting the three single-phase voltage and current fundamental/harmonic wave vectors from the fundamental/harmonic wave decomposition device to perform sequence decomposition and outputting three-phrase voltage and current positive, negative, and zero sequence vectors to the amplitude calculation device.

The invention also provides a method for AC physical signals remote measurement, comprising:

performing analog sampling on an input AC voltage u and/or an AC current i at a sampling interval of $\Delta$ to obtain a voltage sampling value $u_k$ and/or a current sampling value $i_k$;

performing low-pass filtering on the voltage sampling value $u_k$ and/or the current sampling value $i_k$ to remove high frequency components, wherein a cut-off frequency fc of the low-pass filtering satisfies $fc \leq 0.5 \times f_W$ ($f_W$ being the re-sampling frequency);

performing re-sampling at an interval of $M_W$ designated by the receiving side to obtain a voltage re-sampling value $u_j$ and/or a current re-sampling value $i_j$;

storing the voltage re-sampling value $u_j$ and/or the current re-sampling value $i_j$; and outputting the stored data to the receiving side.

In the above solution, the function of the low-pass filtering is to filter out high frequency components, such that an aliasing error will not arise in the re-sampling. The transfer function of the low-pass filtering is chosen as:

$$G(z) = \frac{1}{a_0 + a_1 \cdot z^{-1} + \ldots + a_n \cdot z^{-n}}$$

where n=2, 4, 6, 8 and is the order of the filter; and G(z) is usually an $n^{th}$ Butterworth filter or an $n^{th}$ Chebyshev filter.

If remote measurement of effective values is desired, then in addition to the elements of the above solution, effective values of the analog sampling values need to be further calculated between the analog sampling and the low-pass filtering.

If remote measurement of harmonic waves is desired, then in addition to the elements of the above solution for effective value remote measurement, harmonic wave decomposition needs to be further performed in parallel with the effective value calculating step between the analog sampling and the low-pass filtering.

Since during the process of calculating effective values of harmonic waves, data amount of remote measurement will increase remarkably, the remote measurement method with harmonic wave decomposition needs to include:

storing selection data inputted by the receiving side; and providing a selection switch after the sampling switch, wherein for selection bits controlled by the selection data, when a selection bit is 1, the data is selected and the re-sampling value enters into the register to be stored; otherwise, the re-sampling value is not stored.

If only the data of the $m^{th}$ harmonic wave is desired, then harmonic wave order m set by the receiving side may be stored to control the harmonic wave decomposition to output an $m^{th}$ harmonic wave vector.

Harmonic wave decomposition is performed on $i_k$ and/or $u_k$ in accordance with the order m designated by the receiving side to obtain an $m^{th}$ harmonic wave vector of current, $\dot{I}_k^m$, and/or an $m^{th}$ harmonic wave vector of voltage, $\dot{U}_k^m$. Harmonic wave active power component $P_k^m$ and harmonic wave reactive power component $Q_k^m$ are derived from $\dot{I}_k^m$ and $\dot{U}_k^m$. $P_k^m = \text{Re}(\tilde{I}_k^m \cdot \dot{U}_k^m)$, and $Q_k^m = \text{Im}(\tilde{I}_k^m \cdot \dot{U}_k^m)$. Here, $\tilde{I}_k^m$ is the conjugate of $\dot{I}_k^m$, Re( ) denotes taking the real part, and Im( ) denotes taking the imaginary part. m=1, 2, 3, . . . When m=1, it is the fundamental wave, which usually must be selected. In addition, one or more values of m are designated by the receiving side provisionally, and one or more designated harmonic waves can be measured.

$I_k^m$ (which is the amplitude of $\dot{I}_k^m$) and/or $U_k^m$ (which is the amplitude of $\dot{U}_k^m$), $P_k^m$ and $Q_k^m$ also subject to the low-pass filtering and the re-sampling as described above, to output harmonic wave effective values $I_j^m$ and/or $U_j^m$, $P_j^m$ and $Q_j^m$.

If measurement of three-phrase AC signals is performed, then in addition to the elements of said AC remote measurement method, a sequence decomposition step needs to be further provided to perform sequence decomposition on the three single-phase voltage and/or current fundamental/harmonic wave vectors outputted by the fundamental/harmonic wave decomposition step to obtain three-phrase voltage and/or current positive, negative and zero sequence vectors, each of which is subject to amplitude calculation, real part calculation and imaginary part calculation simultaneously to output voltage and/or current positive, negative and zero sequence effective values, real parts and imaginary parts, which are low-pass filtered to remove high frequency components.

The positive, negative and zero sequence is given by the following well-known equation:

$$\begin{bmatrix} \dot{I}_{(1)k}^m \\ \dot{I}_{(2)k}^m \\ \dot{I}_{(0)k}^m \end{bmatrix} = \frac{1}{3} \cdot \begin{bmatrix} 1 & e^{j\frac{2}{3}\pi} & e^{-j\frac{2}{3}\pi} \\ 1 & e^{-j\frac{2}{3}\pi} & e^{j\frac{2}{3}\pi} \\ 1 & 1 & 1 \end{bmatrix} \cdot \begin{bmatrix} \dot{I}_{ka}^m \\ \dot{I}_{kb}^m \\ \dot{I}_{kc}^m \end{bmatrix}$$

where $\dot{I}_{ka}^m$, $\dot{I}_{kb}^m$, and $\dot{I}_{kc}^m$ are the $k^{th}$ calculated values of the $m^{th}$ harmonic wave vector of the A-phrase, B-phrase, and C-phase currents, respectively, and $\dot{I}_{(1)k}^m$, $\dot{I}_{(2)k}^m$ and $\dot{I}_{(0)k}^m$ are positive, negative and zero sequence vectors of the $m^{th}$ harmonic wave of the three-phrase currents, respectively. The positive, negative and zero sequence vectors of the $m^{th}$ harmonic wave of the three-phrase voltages can also be obtained according to this equation.

If remote measurement is performed with respect to the steady state of the voltage and/or current, then the above method further comprises:

averaging the obtained effective values to obtain their average values $\overline{U}_k$ and/or $\overline{I}_k$, $\overline{P}_k$, and $\overline{Q}_k$; and performing a steady/transient state determination for sending a flag F to the average values in accordance with the outputted effective values, wherein when the effective values are in a steady state process, F=0; otherwise, when the effective values are in a transient state process, F=1; and when F changes from 1 to 0, the average values are reset to zero, and when F=1, the average values are values that cannot be reached, which are removed as bad data upon arrival at the receiving side.

In the above method, the averaging is also a kind of low-pass filtering.

The method for averaging is:

$$\overline{x}_k = \frac{1}{k} \cdot \sum_{l=1}^{k} x_l$$

$$= \frac{1}{k} \cdot [(k-1) \cdot \overline{x}_{k-1} + x_k].$$

In the determination step, the determination is performed as follows. A variance of the input data $x_k$ ($x_k=I_k$ or $U_k$ or $P_k$) is calculated:

$$\hat{s}_k^2 = \frac{k-2}{k-1}\hat{s}_{k-1}^2 + (\bar{x}_k - \bar{x}_{k-1})^2 + \frac{1}{k-1}(\bar{x}_k - x_k)^2.$$

If $|x_k-\bar{x}_k| \leq \sqrt{k} \cdot t_{\alpha/2}(k-1) \cdot \hat{s}_k$, it is in the steady state. Here, $\bar{x}_k$ is the average value, $t_{\alpha/2}$ is a student distribution, $\alpha$ is a risk level designated by the receiving side. The determination is applied to each of $I_k$ or $U_k$ or $P_k$. A steady state requires strict application, in which the F outputted equals to 0 only if the F is 0 in all the three determinations. Generally, it is sufficient to input only $P_k$ for determination.

The determination may also be constructed in accordance with filters. $\alpha$, $\beta$ and $\gamma$ filtering is performed on an input data $x_k$ ($x_k=I_k$ or $U_k$ or $P_k$), to obtain a location component $S_k$, a velocity component $v_k$ and an acceleration component $a_k$ of $x_k$. If $|a_k| \geq a_g$, then it is in a transient state and F=1; otherwise, it is in a steady state and F=0. Here, $a_g$ is a given value. If strict application is required, then there may be additional determinations. If $|v_k| \geq v_g$, then it is in a transient state and F=1; only if both $|a_k|<a_g$ and $|v_k|<v_g$ are satisfied, it is in a steady state and F=0. Here, $v_g$ is a given value. $a_g$ and $v_g$ are related to the bandwidth, i.e. the time constant, of signal $x_k$. Detailed information can be found in materials related to design of $\alpha$, $\beta$ and $\gamma$ filters or design of Kalman filters.

The present invention also provides a method for AC remote measurement suitable for use in a single-phase electric energy meter or the like, comprising:

performing analog sampling on an input AC current i and an AC voltage u to output a current sampling value $i_k$ and a voltage sampling value $u_k$;

performing multiplication accumulation on the current sampling value $i_k$ and the voltage sampling value $u_k$ to output active electric energy $W_k$;

performing low-pass filtering on the current sampling value $i_k$ and the voltage sampling value $u_k$ to remove high frequency components, wherein a cut-off frequency fc of the low-pass filtering satisfies $fc \leq 0.5 \times f_W$ ($f_W$ being the re-sampling frequency);

performing re-sampling on the low-pass-filtered sampling values to obtain re-sampling values;

performing fundamental/harmonic wave decomposition on the re-sampling values to obtain fundamental and $m^{th}$ harmonic wave vectors;

calculating amplitudes of the fundamental and $m^{th}$ harmonic wave vectors to output fundamental and $m^{th}$ harmonic wave amplitudes;

calculating power of the fundamental and $m^{th}$ harmonic wave vectors to obtain fundamental and $m^{th}$ harmonic wave active power and reactive power;

averaging the fundamental and $m^{th}$ harmonic wave amplitudes, active power and reactive power to output their average values in a steady state;

accumulating the fundamental wave reactive power to output reactive electric energy;

re-sampling the average values, the active electric energy and the reactive electric energy to output their re-sampling values;

storing the re-sampling values;

outputting the stored re-sampling values to the receiving side through a bus; and a determining step for sending a flag F to the average values in accordance with the fundamental wave voltage amplitude, the fundamental wave current amplitude or the fundamental wave power in steady state or in transient states, wherein when the flag F changes from 1 to 0, the average values are reset to zero, and when F=1, the average values are values that cannot be reached, which are removed as bad data on the receiving side.

For three-phrase AC, the present invention further provides an AC remote measurement method suitable for used in a three-phrase electric energy meter or the like, which, in addition to the elements of the above method for AC physical signal remote measurement, further comprises a fundamental/harmonic wave decomposition step, an amplitude calculation step, a real part calculation step and an imaginary part calculation step to output amplitudes, real parts and imaginary parts of the three-phrase AC fundamental/harmonic wave positive, negative, and zero sequence components to the averaging step.

For AC, the analog sampling channel is used to obtain both voltage and current sampling values. Current and voltage effective values and power are calculated accurately. Not only waveform values are outputted by re-sampling, effective values, steady state values and their fundamental and harmonic wave effective values and steady state values are also outputted. Low-pass filtering before the re-sampling avoids aliasing errors. Determination of steady state ensures that transient state data will not sneak into steady state data. Thus, various requirements by the receiving side on remote measurement data are satisfied.

DETAILED DESCRIPTION

Embodiments of the apparatus and method according to the invention will be described below in connection with the accompanying drawings.

Figure 1:
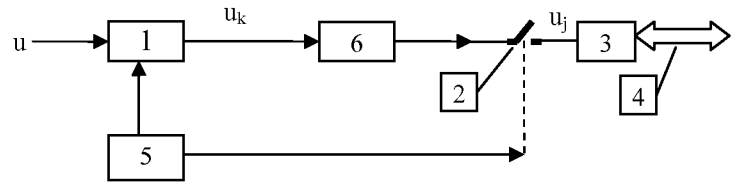
FIG. 1 shows a single-phase AC voltage waveform remote measurement apparatus and method according to the invention.

FIG. 1 shows a single-phase AC voltage waveform remote measurement apparatus and method.

In FIG. 1, the voltage waveform remote measurement apparatus includes an analog sampling channel 1, a sampling switch 2, a register 3, a bus 4, and a timing controller 5. The apparatus further includes a digital low-pass filter 6. An input AC voltage signal u goes through the analog sampling channel 1 to output a voltage sampling value $u_k$, which is filtered by the digital low-pass filter 6 to remove high frequency components and then sent to the sampling switch 2. Re-sampling is performed by the sampling switch 2, and then a voltage re-sampling value $u_j$ is outputted and stored in the register 3. Under the control of the bus 4, the register 3 outputs data to the receiving side through the bus 4. The analog sampling channel 1 and the sampling switch 2 are controlled by the timing controller 5. The function of the digital low-pass filter 6 is to filter out high frequency components, and its cut-off frequency $f_c$ should be lower than 0.5 times the re-sampling frequency $f_W$.

The apparatus of the embodiment of FIG. 1 is also applicable to current waveform remote measurement, as long as the voltage signals are replaced with current signals. Similarly, the apparatus of FIG. 1 is also applicable to waveform remote measurement for multi-phase voltage and multi-phase current.

Figure 2:
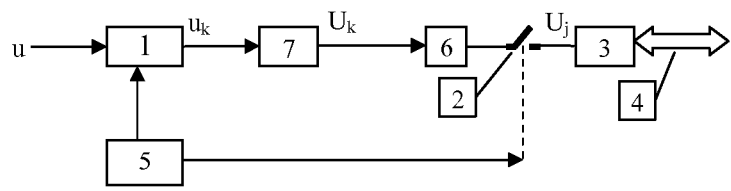
FIG. 2 shows a single-phase AC voltage effective value remote measurement apparatus and method according to the invention.

FIG. 2 shows a single-phase AC voltage effect value remote measurement apparatus and method.

In FIG. 2, the single-phase AC voltage effect value remote measurement apparatus includes an analog sampling channel 1, an effect value calculation device 7, a sampling switch 2, a register 3, a bus 4, and a timing controller 5. The apparatus further includes a digital low-pass filter 6. An input voltage signal u goes through the analog sampling channel 1 to output a voltage sampling value $u_k$, which goes through the effect value calculation device 7 to output a voltage effect value $U_k$. The voltage effect value $U_k$ is filtered by the digital low-pass filter 6 to remove high frequency components and then sent to the sampling switch 2. Re-sampling is performed by the sampling switch 2, and then a voltage re-sampling value $U_j$ is outputted and stored in the register 3. Under the control of the bus 4, the register 3 outputs data to the receiving side through the bus 4. The analog sampling channel 1 and the sampling switch 2 are controlled by the timing controller 5. The function of the low-pass filter 6 is to filter out high frequency components, and its cut-off frequency $f_c$ should be lower than 0.5 times the re-sampling frequency $f_T$.

The apparatus and method of the embodiment of FIG. 2 are also applicable to single-phase current effect value remote measurement, as long as the voltage signals are replaced with current signals. Similarly, the apparatus and method of FIG. 2 are also applicable to effect value remote measurement for multi-phase voltage and multi-phase current.

Figure 3:
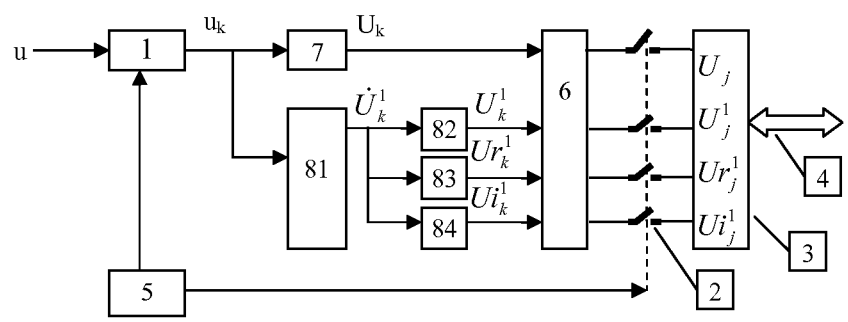
FIG. 3 shows a single-phase AC voltage effect value remote measurement apparatus and method with harmonic wave decomposition according to the invention.

FIG. 3 shows a single-phase AC voltage effect value remote measurement apparatus and method with a harmonic wave decomposition device.

In FIG. 3, a fundamental wave decomposition process is further included in addition to the elements of FIG. 2. The voltage sampling value $u_k$ outputted from the analog sampling channel 1 goes through a fundamental wave decomposition device 81 to obtain a fundamental wave vector $\dot{U}_k^1 \cdot \dot{U}_k^1$ is inputted to each of an amplitude calculation device 82, a real part calculation device 83 and an imaginary part calculation device 84 simultaneously to output a voltage fundamental wave amplitude $U_k^1$, a voltage fundamental wave real part $Ur_k^1$ and a voltage fundamental wave imaginary part $Ui_k^1$, respectively. The $U_k^1$, $Ur_k^1$ and $Ui_k^1$ are also filtered by the digital low-pass filter 6 to remove high frequency components, and then re-sampled by the sampling switch 2 to be outputted and stored in the register 3.

Figure 4:
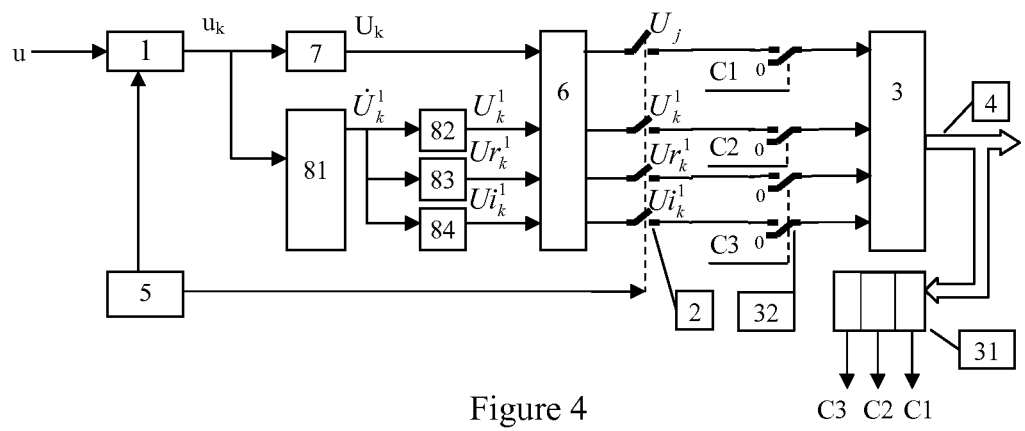
FIG. 4 shows a variant of the apparatus of FIG. 3.

FIG. 4 shows a variant of FIG. 3. In practical applications, the real part and imaginary part of the fundamental wave are often used, while the effect value and the fundamental wave effect value may not be used so often. Therefore, as shown in FIG. 4, a selection data register 31 for registering selection data may be further included in addition to the elements of FIG. 3. The selection data written in the selection data register 31 is controlled from the receiving side by the bus 4. A selection switch 32 is provided after the sampling switch 2. For data bits controlled by the selection data register 31, when a selection bit is 1, the data is selected and enters into the register 3; otherwise, the data is not in the register 3. Thus, whether the effect value, the fundamental wave effect value, and the real part and imaginary part of the fundamental wave are inputted into the register 3 is controlled by the selection data written from the receiving side.

Figure 5:
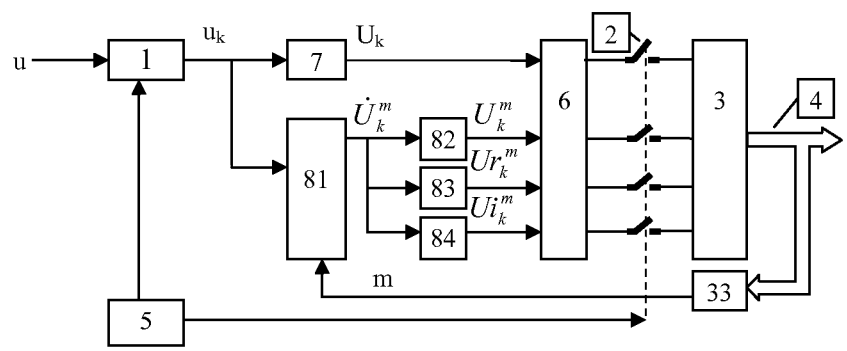
FIG. 5 shows another variant of the apparatus of FIG. 3.

The apparatus and method of FIG. 3 may also be used for harmonic wave components, as shown in FIG. 5.

FIG. 5 shows another variant of FIG. 3.

In addition to the elements of FIG. 3, a harmonic wave frequency register 33 is further included in FIG. 5 for registering data m. Data written to the harmonic wave frequency register 33 from the receiving side is controlled by the bus 4. The output of the harmonic wave frequency register 33 is connected to the harmonic wave decomposition device 81 to control the harmonic wave decomposition device 81 to output an $m^{th}$ harmonic wave vector $\dot{U}_k^m$. Other elements are the same as those of FIG. 3.

Figure 6:
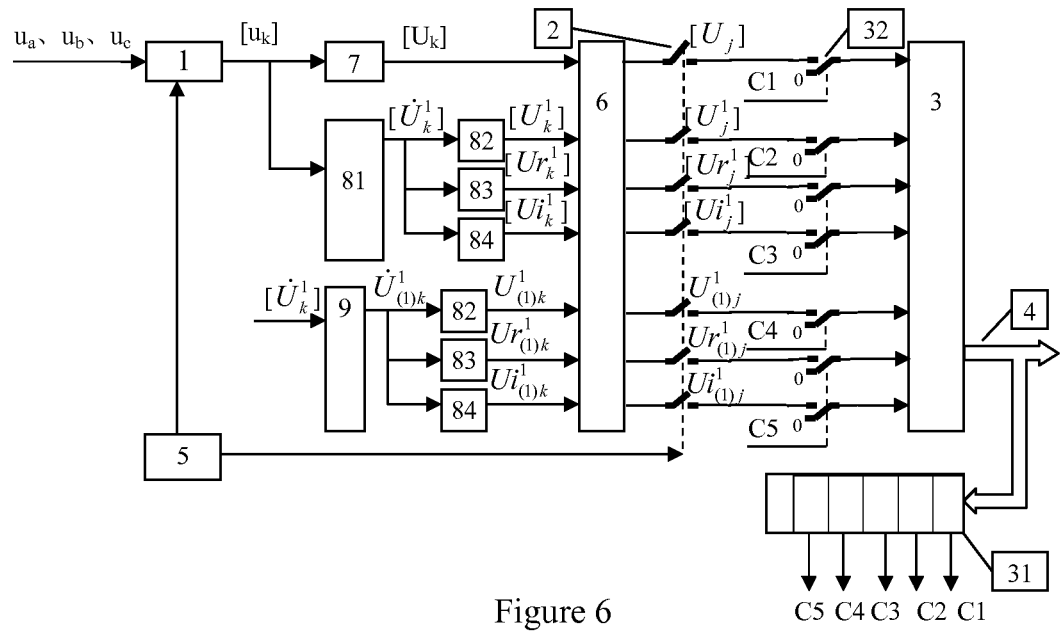
FIG. 6 shows a three-phrase voltage remote measurement apparatus and method with harmonic wave decomposition according to the invention.

Three-phase voltage is applied to FIG. 4, as shown in FIG. 6. Here, $[u_k]$ denotes a vector constituted by three-phrase voltage sampling values $u_{ak}$, $u_{bk}$, and $u_{ck}$. The same applies to other signals. In addition to the elements of FIG. 4, a sequence decomposition device 9 is further included. The three single-phase voltage fundamental wave values $[\dot{U}_k^1]$ outputted by the fundamental wave decomposition device 81 of FIG. 4 are inputted to the sequence decomposition device 9 to obtain a positive sequence component $\dot{U}_{(1)k}^1$. $\dot{U}_{(1)k}^1$ goes through each of the amplitude calculation device 82, the real part calculation device 83 and the imaginary part calculation device 84 simultaneously to obtain a positive sequence effect value, real part and imaginary part, which are filtered by the digital low-pass filter 6 to remove high frequency components. The number of bits of the selection data register 31 and that of the switch 32 are increased accordingly. Other elements are the same as those of FIG. 4.

If an application requires, processes for negative sequence and zero sequence may be added in addition to the elements of FIG. 6.

Figure 7:
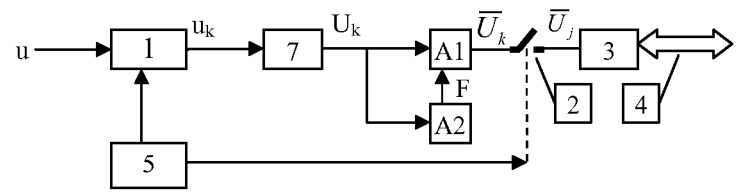
FIG. 7 shows a voltage steady state value remote measurement apparatus and method.

FIG. 7 shows a voltage steady state value remote measurement apparatus and method.

In FIG. 7, the voltage steady state value remote measurement apparatus according to the invention includes an analog sampling channel 1, an effect value calculation device 7, a sampling switch 2, a register 3, a bus 4, and a timing controller 5. The digital low-pass filter 6 further includes an averaging unit A1 and a determination unit A2 provided after the effect value calculation device 7. After an analog voltage u is inputted, it goes through the analog sampling channel 1 and the effect value calculation device 7 to output a voltage effect value $U_k$. $U_k$, on one hand, goes through the averaging unit A1 to output a voltage average value $\overline{U}_k$, which is then re-sampled by the sampling switch 2 to be registered into register 3. The register 3, under the control of bus 4, outputs data through the bus 4 to the receiving side. On the other hand, $U_k$ is inputted into the determination unit A2, which provides a flag F to the averaging unit A1. When $U_k$ is in a steady state process, F=0; otherwise, when $U_k$ is in a transient state process, F=1. When F changes from 1 to 0, the average value $\overline{U}_k$ is reset to zero.

When F=1, $\overline{U}_k$ is a value that cannot be reached. Upon arrival at the receiving side, values that cannot be reached by $\overline{U}_k$ are removed as bad data.

Similarly, in accordance with FIGS. 3-6 and 7, outputs of fundamental wave, harmonic wave and positive sequence (negative sequence, zero sequence) steady state values can be obtained.

Active power P, reactive power Q, active electric energy W and reactive electric energy V can be derived from the sampling values of voltage and current. Fundamental wave active power $P^1$, fundamental wave reactive power $Q^1$, fundamental wave active electric energy $W^1$ and fundamental wave reactive electric energy $V^1$ can be derived from the fundamental wave voltage and the fundamental wave current. Fundamental wave positive sequence active power $P^1_{(1)}$, fundamental wave positive sequence reactive power $Q^1_{(1)}$, fundamental wave positive sequence active electric energy $W^1_{(1)}$ and fundamental wave positive sequence reactive electric energy $V^1_{(1)}$ can be derived from the fundamental wave positive sequence voltage and the fundamental wave positive sequence current. Thus, their effect value output and steady state value output can be obtained.

Figure 8:
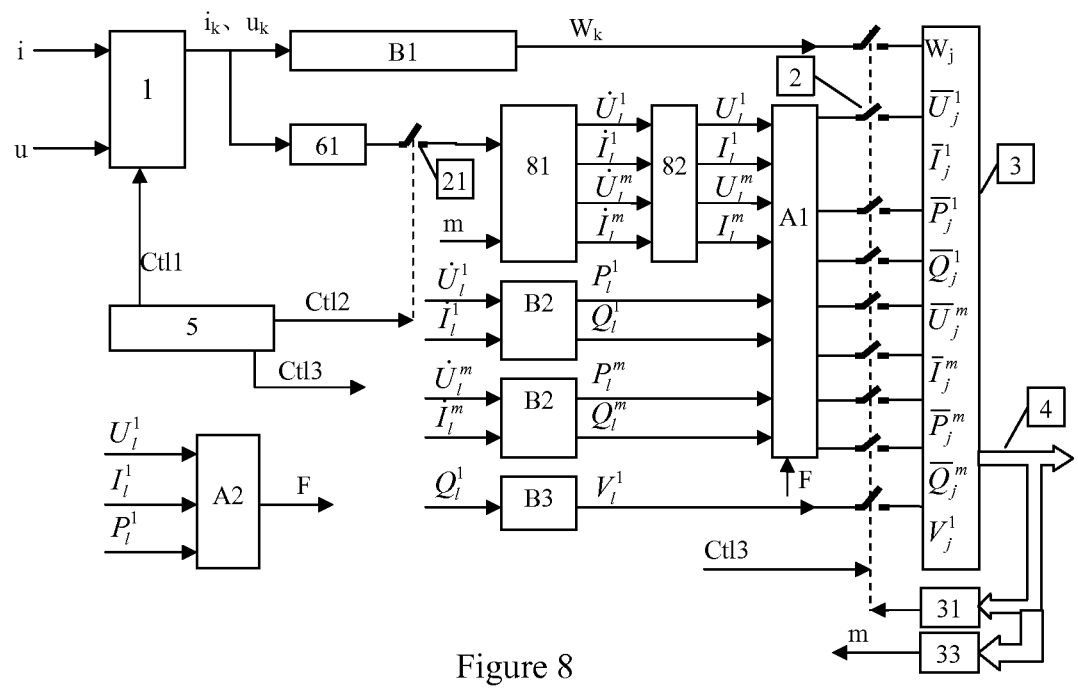
FIG. 8 shows a single-phase AC remote measurement apparatus and method.

Combining the above apparatuses, FIG. 8 shows a single-phase AC remote measurement apparatus and method, which can be used for metering and measuring devices such as a single-phase electric energy meter or the like.

In FIG. 8, an AC current i and an AC voltage u are inputted and go through the analog sampling channel 1 to obtain a current sampling value $i_k$ and a voltage sampling value $u_k$. On one hand, the current sampling value $i_k$ and the voltage sampling value $u_k$ go through a multiplication accumulator B1 to obtain active electric energy $W_k$. On the other hand, the current sampling value $i_k$ and the voltage sampling value $u_k$ are filtered by a low-pass filter 61 to remove high frequency components, re-sampled by a sampling switch 21, and then inputted to a harmonic wave decomposition device 81 to obtain fundamental and $m^{th}$ harmonic wave vectors. The fundamental and $m^{th}$ harmonic wave vectors, on one hand, go through an amplitude calculation circuit 82 to obtain amplitudes of the fundamental wave and the $m^{th}$ harmonic waves, and on the other hand, go through a power calculation device B2 (a conjugate of the current vector is determined, multiplied with the voltage and then added together, and a real part and an imaginary part are calculated) to obtain the active power and reactive power of the fundamental wave and the $m^{th}$ harmonic wave. The amplitudes, active power and reactive power of the fundamental wave and the $m^{th}$ harmonic wave go through an averaging device A1 to obtain their average values in a steady state. The reactive power of the fundamental wave goes through an accumulator B3 to output reactive electric energy. The active electric energy, the reactive electric energy, and the averages values outputted by the averaging device A1 all go through the sampler 2 and then to register 3. The register 3, under the control of the bus 4, outputs data through the bus 4 to the receiving side. The fundamental wave voltage amplitude, the fundamental wave current amplitude or the fundamental wave power goes through a determination unit A2 to provide a flag F. When the flag F changes from 1 to 0, the averaging circuit A1 is reset to zero. When F=1, the average values outputted by A1 are values that cannot be reached by the respective quantities. On the receiving side, the values that cannot be reached are removed as bad data. The analog sampling channel 1 and sampling switches 2 and 21 are controlled by the timing controller 5. Other elements are as shown in the foregoing figures.

The sampling switch 21 and the low-pass filter 61 in FIG. 8 are introduced in consideration of the insufficient computation speed of digital circuits. This is because that All parts, except the analog sampling channel 1, are doing digital processing, which can be performed by CPLD (Complex Programmable Logic Device), FPGA (Field Programmable Gate Array), ASIC (Application Specific Integrated circuit) or similar digital circuits, and can also be implemented by a program of a DSP (Digital Signal Processor). The frequency of analog sampling has been designed to be very high in order to ensure the accuracy of active electric energy. However, the computation speed of digital circuits is not high enough. Thus, re-sampling is needed and the sampling switch 21 is introduced. In order to ensure that an aliasing error will not arise after the re-sampling, the low-pass filter 61 is introduced, and its cut-off frequency should be lower than 0.5 times the re-sampling frequency of the sampling switch 21. If the digital processing speed is high enough, the low-pass filter 61 and the sampling switch 21 may be omitted.

In FIG. 8, the reactive electric energy is fundamental wave reactive electric energy. This is because that in a circuit involving harmonic waves, the application first cares about the fundamental wave power, and how much reactive power needs to be supplemented to satisfy the requirement of the power factor. It then cares about how much the content of harmonic waves is and which harmonic wave is bigger. Therefore, the m in the figure can be specified by the receiving side. Certainly, it is also possible to specify a plurality of harmonic waves and obtain remote measurement results for them simultaneously. Since this is just a parallelization of the above circuits, it is not detailed here.

Figure 9:
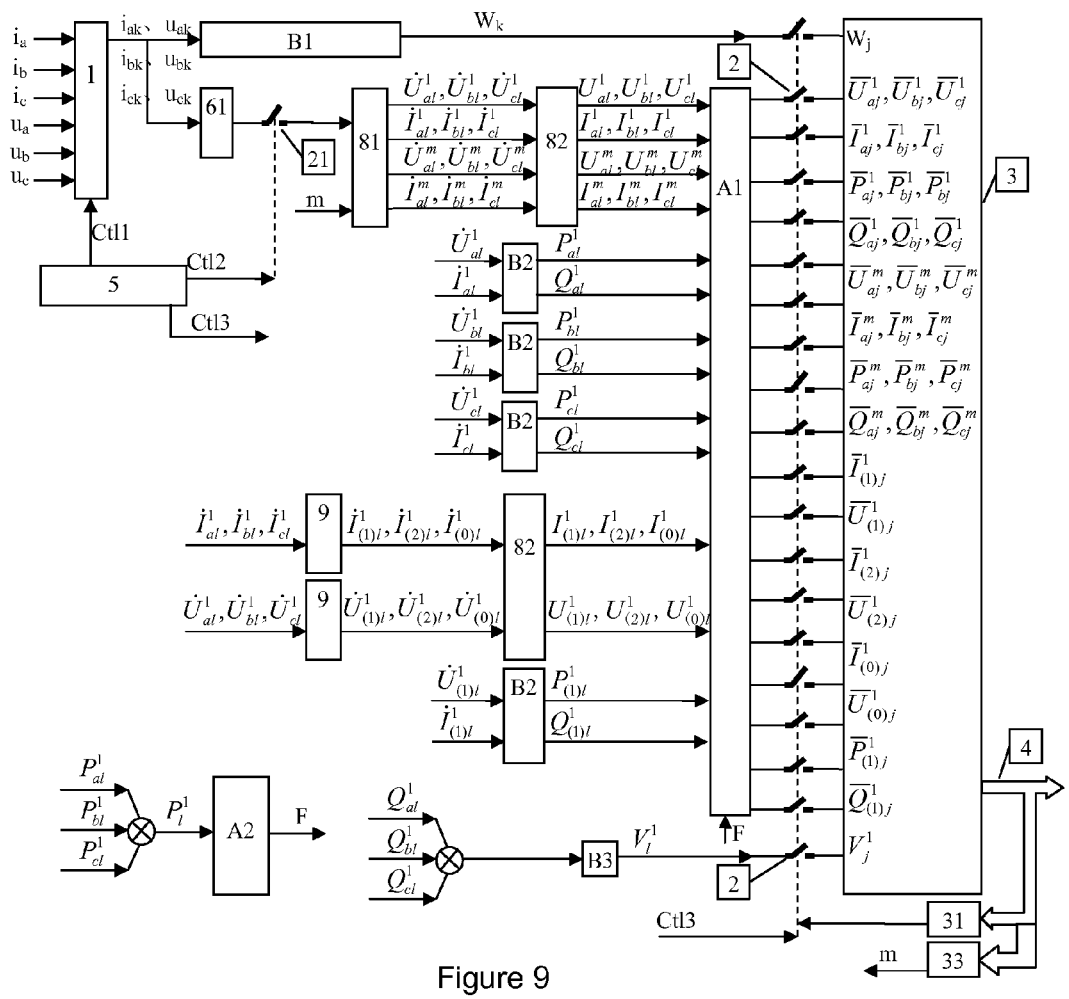
FIG. 9 shows a three-phrase AC remote measurement apparatus and method.

Combining the foregoing figures, FIG. 9 shows a three-phase AC remote measurement apparatus and method, which can be used for metering and measuring devices such as a three-phase electric energy meter or the like.

In FIG. 9, three-phrase AC currents $i_a$, $i_b$, $i_c$ and three-phrase AC voltages $u_a$, $u_b$, $u_c$ are inputted. In addition to the elements of FIG. 8, a positive sequence decomposition device 9 is further included for inputting the three single-phase fundamental wave currents and the three single-phase fundamental wave voltages from the fundamental wave decomposition device 81 and outputting three-phrase voltage fundamental wave positive, negative and zero sequence vectors and current fundamental wave positive, negative and zero sequence vectors to the amplitude calculation device 82. The amplitude calculation device 82 outputs voltage and current fundamental wave positive, negative and zero sequence amplitudes to the averaging device A1. The fundamental wave positive sequence current vector and the fundamental wave positive sequence voltage vector go through the power calculation device B2 to obtain fundamental wave positive sequence active power and fundamental wave positive sequence reactive power, which are also inputted to the averaging device A1. The input to the accumulator B3 should be the sum of the three-phrase fundamental wave reactive power. Similarly, the input to the determination unit A2 should be the sum of the three-phrase fundamental wave active power. Other elements are the same as those of FIG. 8.

If necessary, FIG. 9 may be extended to fundamental wave negative sequence or zero sequence active and reactive power, and positive, negative and zero sequence active and reactive power of the $m^{th}$ harmonic wave.

Preferably, in addition to the elements of FIG. 9, output of positive, negative and zero sequence effect values of current and voltage is further provided in accordance with FIG. 4 in a remote measurement apparatus in a measurement unit for a digital substation or a power plant. If output of waveform values is further provided in accordance with FIG. 1, then the remote measurement requirements of various substations and power plants can be satisfied.

The parts other than the analog sampling channel of the above embodiments can be achieved by CPLD, FPGA, ASIC or similar digital circuits, and can also be readily implemented by a program of a DSP. Detailed information can be found in their development manuals. It is also possible that the analog sampling channel and the digital processing parts are all integrated into one single chip.

The embodiments of the invention merely provide some specific implementations. Various variations can be made by those of ordinary skills in the art without departing from the spirit and concept of the present invention, and are all within the scope of the following claims.

What is claimed is:

1. An apparatus for alternating current (AC) physical signal measurement and data acquisition, comprising:
    an analog sampling channel configured to: perform analog sampling on an input AC physical signal to obtain an analog sampling value;
    a sampling switch configured to: re-sample the analog sampling value to satisfy a requirement by a receiving side on data acquisition frequency;
    a register configured to: store a re-sampling value from the sampling switch;
    a bus configured to: output the re-sampling value in the register to the receiving side;
    a timing controller configured to: control the analog sampling channel and the re-sampling frequency of the sampling switch; and
    a digital low-pass filter, which has an input connected with the analog sampling value outputted by the analog sampling channel and an output connected with the sampling switch, filters out high frequency components from the analog sampling value, wherein a cut-off frequency of the digital low-pass filter is lower than 0.5 times the re-sampling frequency of the sampling switch.

2. The apparatus for AC physical signal measurement and data acquisition according to claim 1, wherein
    an effective value calculation device is provided between the analog sampling channel and the digital low-pass filter, and configured to: calculate an effect value for the analog sampling value from the analog sampling channel and ouput the effect value to the digital low-pass filter.

3. The apparatus for AC physical signal measurement and data acquisition according to claim 2, wherein
    a fundamental/harmonic wave decomposition device is provided between the analog sampling channel and the digital low-pass filter in parallel with the effect value calculation device, and configured to: perform fundamental/harmonic wave decomposition on the analog sampling value from the analog sampling channel to obtain a fundamental/harmonic wave vector; and
    an amplitude calculation device, a real part calculation device and an imaginary part calculation device, which receive the fundamental/harmonic wave vector from the fundamental/harmonic wave decomposition device simultaneously to output a fundamental/harmonic wave amplitude, a fundamental/harmonic wave real part and a fundamental/harmonic wave imaginary part, respectively, to the digital low-pass filter.

4. The apparatus for AC physical signal measurement and data acquisition according to claim 3, wherein
    a selection data register configured to: store selection data set by the receiving side though the bus; and
    a selection switch is provided before the resampling value register, wherein for data bits controlled by the selection data register, when a selection bit is 1, the resampling data is selected and enters into the resampling value register; otherwise, the resampling data is not in the resampling value register.

5. The apparatus for AC physical signal measurement and data acquisition according to claim 4, further comprising:
    a sequence decomposition device, which performs sequence decomposition on the three single-phase AC fundamental/harmonic wave vectors outputted by the fundamental/harmonic wave decomposition device to obtain three-phrase AC fundamental/harmonic wave positive sequence, negative sequence and zero sequence vectors, each of which goes through the amplitude calculation device, the real part calculation device and the imaginary part calculation device simultaneously to output three-phrase AC fundamental/harmonic wave positive, negative, and zero sequence effective values, real parts and imaginary parts, which are filtered by the digital low-pass filter to remove high frequency components.

6. The apparatus for AC physical signal measurement and data acquisition according to claim 3, wherein a harmonic wave frequency register configured to: store harmonic wave order data m set by the receiving side to control the fundamental/harmonic wave decomposition device to output an $m^{th}$ harmonic wave vector.

7. The apparatus for AC physical signal measurement and data acquisition according to claim 2, wherein the digital low-pass filter includes:
    an averaging device which is connected with the effective value calculation device, obtains an average value of the effective value outputted by the effective value calculation device, and is then connected with the sampling switch; and
    a determination device which is connected with the effective value calculation device, and provides a flag F to the averaging device in accordance with the effective value in the steady state or in the transient state outputted by the effective value calculation device, wherein when the effective value is in a steady state process, F=0; otherwise, when the effective value is in a transient state process, F=1; and
    when F changes from 1 to 0, the average value is reset to zero, and when F=1, the average value is a value that cannot be reached, which, upon arrival at the receiving side, is removed as bad data.

8. An apparatus for alternating current (AC) physical signals measurement and data acquisition, comprising:
    an analog sampling channel configured to: input an AC current i and an AC voltage u and output a current sampling value $i_k$ and a voltage sampling value $u_k$;
    a multiplication accumulator configured to: input the current sampling value $i_k$ and the voltage sampling value $u_k$ and output active electric energy $W_k$;
    a fundamental/harmonic wave decomposition device configured to: perform fundamental/harmonic wave decomposition on the sampling values to obtain fundamental and $m^{th}$ harmonic wave vectors;
    an amplitude calculation device configured to: input the fundamental and $m^{th}$ harmonic wave vectors from the fundamental/harmonic wave decomposition device and output fundamental and $m^{th}$ harmonic wave amplitudes;

a power calculation device configured to: input the fundamental and $m^{th}$ harmonic wave vectors from the fundamental/harmonic wave decomposition device to obtain fundamental and $m^{th}$ harmonic wave active power and reactive power;

an accumulator configured to: input the fundamental wave reactive power from the power calculation device and outputting output reactive electric energy;

an averaging device configured to: input the voltage and current fundamental wave amplitudes from the amplitude calculation device and the active power from the power calculation device and output their average values;

a sampling switch configured to: input the average values from the averaging device, the active electric energy from the multiplication accumulator, and the reactive electric energy from the accumulator, perform re-sampling, and output their re-sampling values;

a resampling value register configured to: store the re-sampling values from the sampling switch;

a bus configured to: output the re-sampling values in the resampling value register to a receiving side;

a determination unit configured to: send a flag F to the averaging device in accordance with the fundamental wave voltage amplitude, the fundamental wave current amplitude or the fundamental wave power in the steady state or in the transient state, wherein when the flag F changes from 1 to 0, the averaging device is reset to zero, and when F=1, the output of the averaging device is a value that cannot be reached, which is removed as bad data on the receiving side;

a timing controller configured to: perform timing control on the analog sampling channel and the sampling switch;

a selection data register configured to: store selection data set by the receiving side through the bus to select data bits to be entered into the resampling value register; and a harmonic wave frequency register configured to: store harmonic wave order data m set by the receiving side to control the fundamental/harmonic wave decomposition device to output the fundamental and $m^{th}$ harmonic wave vectors.

9. The apparatus for AC measurement and data acquisition according to claim 8, further comprising:

a sequence decomposition device configured to: input the three single-phase voltage and current fundamental wave values from the fundamental/harmonic wave decomposition device and output voltage and current fundamental wave positive, negative, and zero sequence vectors to the amplitude calculation device.

10. A method for alternating current (AC) physical signals measurement and data acquisition, comprising:

performing analog sampling on an input AC voltage u and/or an AC current i at a sampling time interval of $\Delta$ to obtain a voltage sampling value $u_k$ and/or a current sampling value $i_k$;

performing low-pass filtering on the voltage sampling value $u_k$ and/or the current sampling value $i_k$ to remove high frequency components;

performing re-sampling at an interval of $M_w$ designated by a receiving side (with a re-sampling frequency of $f_w$), to obtain a voltage re-sampling value $u_j$ and/or a current re-sampling value $i_j$, wherein a cut-off frequency fc of the low-pass filtering satisfies $fc \leq 0.5 \times f_w$;

storing the voltage re-sampling value $u_j$ and/or the current re-sampling value $i_j$; and outputting the re-sampling values in accordance with a control signal.

11. The method for AC physical signals measurement and data acquisition according to claim 10, wherein effective values of the sampling values are calculated between the analog sampling and the low-pass filtering.

12. The method for AC physical signals measurement and data acquisition according to claim 11, wherein fundamental/harmonic wave decomposition is performed between the analog sampling and the digital low-pass filtering in parallel with the effective value calculation to obtain fundamental/harmonic wave amplitudes, fundamental/harmonic wave real parts and fundamental/harmonic wave imaginary parts.

13. The method for AC physical signals measurement and data acquisition according to claim 12, wherein the step of outputting the re-sampling value according with the control signal includes:

setting re-sampling value register to store re-sampling value, setting selection data register to store selection data set by the receiving side through a bus; and providing a selection switch after re-sampling, wherein for selection bits controlled by a selection data register, when a selection bit is 1, the data is selected and the re-sampling value enters into the re-sampling value register to be stored; otherwise, the re-sampling value is not stored.

14. The method for AC physical signals measurement and data acquisition according to claim 12, wherein harmonic wave order m set by the receiving side is stored to control the fundamental/harmonic wave decomposition to output fundamental and $m^{th}$ harmonic wave vectors.

15. The method for AC physical signals remote measurement according to claim 12, wherein sequence decomposition is performed on the three single-phase fundamental/harmonic wave vectors on which the fundamental/harmonic wave decomposition has been performed to obtain positive, negative and zero sequence vectors, performing amplitude calculation, real part calculation and imaginary part calculation simultaneously to output fundamental/harmonic wave positive, negative and zero sequence effective values, real parts and imaginary parts, and performing low-pass filtering to remove high frequency components.

16. A method for alternating current (AC) measurement and data acquisition, comprising:

performing analog sampling on an input AC current i and an AC voltage u to output a current sampling value $i_k$ and a voltage sampling value $u_k$;

performing multiplication accumulation on the current sampling value $i_k$ and the voltage sampling value $u_k$ to output active electric energy $W_k$;

performing fundamental/harmonic wave decomposition on the sampling values to obtain fundamental and $m^{th}$ harmonic wave vectors;

calculating amplitudes of the fundamental and $m^{th}$ harmonic wave vectors to output fundamental and $m^{th}$ harmonic wave amplitudes;

calculating power of the fundamental and $m^{th}$ harmonic wave vectors to obtain fundamental and $m^{th}$ harmonic wave active power and reactive power;

averaging the fundamental and $m^{th}$ harmonic wave amplitudes, active power and reactive power to output their average values in a steady state;

a determining step for sending a flag F to the average values in accordance with the fundamental wave voltage amplitude, the fundamental wave current amplitude or the fundamental wave power in the steady state or in the transient state, wherein when the flag F changes from 1 to 0, the average values are reset to zero, and when F=1, the average values are values that cannot be reached, which are removed as bad data on a receiving side; and accumulating the fundamental wave reactive power to output reactive electric energy;

re-sampling the average values, the active electric energy and the reactive electric energy to output their re-sampling values;

storing the re-sampling values;

outputting the stored re-sampling values to the receiving side through a bus.

17. The method for AC measurement and data acquisition according to claim 16, wherein sequence decomposition is performed on the three single-phase voltage and current fundamental wave values from the fundamental/harmonic wave decomposition to output voltage positive, negative, and zero sequence vectors and current positive, negative, and zero sequence vectors to calculate their amplitudes.

* * * * *